(12) United States Patent
Engdegard et al.

(10) Patent No.: US 7,487,097 B2
(45) Date of Patent: Feb. 3, 2009

(54) ADVANCED PROCESSING BASED ON A COMPLEX-EXPONENTIAL-MODULATED FILTERBANK AND ADAPTIVE TIME SIGNALLING METHODS

(75) Inventors: Jonas Engdegard, Stockholm (SE); Lars Villemoes, Jaerfaella (SE)

(73) Assignee: Coding Technologies AB, Stockholm (SE)

( * ) Notice: Subject to any disclaimer, the term of this patent is extended or adjusted under 35 U.S.C. 154(b) by 0 days.

(21) Appl. No.: 11/260,659

(22) Filed: Oct. 26, 2005

(65) Prior Publication Data

US 2006/0053018 A1 Mar. 9, 2006

Related U.S. Application Data

(63) Continuation of application No. PCT/EP2004/004607, filed on Apr. 30, 2004.

(30) Foreign Application Priority Data

Apr. 30, 2003 (SE) .................................. 0301273

(51) Int. Cl.
  *G01L 19/02* (2006.01)
(52) U.S. Cl. ...................................... 704/500
(58) Field of Classification Search .................. 704/500
  See application file for complete search history.

(56) References Cited

U.S. PATENT DOCUMENTS

| 5,619,577 | A | * | 4/1997 | Hasler ........................... 381/14 |
| 5,844,610 | A | * | 12/1998 | Perdrieau et al. ....... 375/240.11 |
| 5,848,164 | A | * | 12/1998 | Levine ......................... 381/61 |
| 5,890,125 | A | * | 3/1999 | Davis et al. .................. 704/501 |
| 6,104,996 | A | | 8/2000 | Yin |
| 6,501,860 | B1 | * | 12/2002 | Charrier et al. ............. 382/240 |
| 6,738,480 | B1 | * | 5/2004 | Berthault et al. .............. 381/66 |
| 7,382,886 | B2 | | 6/2008 | Henn et al. |
| 7,391,870 | B2 | | 6/2008 | Herre et al. |
| 2003/0108214 | A1 | * | 6/2003 | Brennan et al. ............. 381/94.7 |
| 2003/0219130 | A1 | | 11/2003 | Baumgarte et al. |

FOREIGN PATENT DOCUMENTS

| EP | 0 843 503 A | 5/1998 |
| GB | 2 353 926 A | 3/2001 |
| WO | WO91/20167 A | 12/1991 |
| WO | WO03/007656 | 1/2003 |

OTHER PUBLICATIONS

Schuijers, E., et al. "Advance in Parametric Coding for High-Quality Audio." Audio Engineering Society 11th Convenstion. Mar. 22-25, 2003. Amsterdam, The Netherlands.

* cited by examiner

*Primary Examiner*—Susan McFadden
(74) *Attorney, Agent, or Firm*—Michael A. Glenn; Glenn Patent Group

(57) ABSTRACT

A synthesizer for generating a decorrelation signal using an input signal is operative on a plurality of subband signals, wherein a subband signal includes a sequence of at least two subband samples, the sequence of the subband samples representing a bandwidth of the subband signal, which is smaller than a bandwidth of the input signal. The synthesizer includes a filter stage for filtering each subband signal using a reverberation filter to obtain a plurality of reverberated subband signals, wherein a plurality of reverberated subband signals together represent the decorrelation signal. This decorrelation signal is used for reconstructing a signal based on a parametrically encoded stereo signal consisting of a mono signal and a coherence measure.

21 Claims, 5 Drawing Sheets

ADVANCED PROCESSING BASED ON A COMPLEX-EXPONENTIAL-MODULATED FILTERBANK AND ADAPTIVE TIME SIGNALLING METHODS

CROSS-REFERENCE TO RELATED APPLICATION

This application is a continuation of copending International Application No. PCT/EP04/004607, filed Apr. 30, 2004, which designated the United States, and is incorporated herein by reference in its entirety.

TECHNICAL FIELD

The present invention relates to audio source coding systems but the same methods could also be applied in many other technical fields. Different techniques that are useful for audio coding systems using parametric representations of stereo properties are introduced.

BACKGROUND OF THE INVENTION AND PRIOR ART

The present invention relates to parametric coding of the stereo image of an audio signal. Typical parameters used for describing stereo image properties are inter-channel intensity difference (IID), inter-channel time difference (ITD), and inter-channel coherence (IC). In order to re-construct the stereo image based on these parameters, a method is required that can re-construct the correct level of correlation between the two channels, according to the IC parameter. This is accomplished by a de-correlation method.

There are a couple of methods available for creation of decorrelated signals. Ideally, a linear time invariant (LTI) function with all-pass frequency response is desired. One obvious method for achieving this is by using a constant delay. However, using a delay, or any other LTI all-pass functions, will result in non-all-pass response after adding the non-processed signal. In the case of a delay, the result will be a typical comb-filter. The comb-filter often gives an undesirable "metallic" sound that, even if the stereo widening effect can be efficient, reduces much naturalness of the original.

Frequency domain methods for generating a de-correlated signal by adding a random sequence to the IID values along the frequency axis, where different sequences are used for the different audio channels, are also known from prior art. One problem with frequency domain decorrelation by the random sequence modifications is the introduction of pre-echoes. Subjective tests have shown that for non-stationary signals, pre-echoes are by far more annoying than post-echoes, which is also well supported by established psycho acoustical principles. This problem could be reduced by dynamically adapting transform sizes to the signal characteristics in terms of transient content. However, switching transform sizes is always a hard (i.e., binary) decision that affects the full signal bandwidth and that can be difficult to accomplish in a robust manner.

United States patent application publication US 2003/0219130 A1 discloses a coherence-based audio coding and synthesis. In particular, an auditory scene is synthesized from a mono audio signal by modifying, for each critical band, an auditory scene parameter such as an inter-aural level difference (ILD) and/or an inter-aural time difference (ITD) for each subband within the critical band, where the modification is based on an average estimated coherence for the critical band. The coherence-based modification produces auditory scenes having object widths, which more accurately match the widths of the objects in the original input auditory scene. Stereo parameters are the well-known BCC parameters, wherein BCC stands for binaural cue coding. When generating two different decorrelated output channels, frequency coefficients as obtained by a discrete Fourier transform are grouped together in a single critical band. Based on the inter-channel coherence measure, weighting factors are multiplied by a pseudo-random sequence which is preferably chosen such that the variance is approximately constant for all critical bands, and the average is "0" within each critical band. The same sequence is applied to the spectral coefficients of each different frame.

SUMMARY OF THE INVENTION

It is an object of the present invention to provide a decoding concept for parametrically encoded multi-channel signals or an encoding concept for generating such signals which result in a good audio quality and a good coding efficiency.

In accordance with a first aspect, the present invention provides an apparatus for generating a decorrelation signal using an input signal, having: means for providing a plurality of subband signals, wherein a subband signal includes a sequence of at least two subband samples, the sequence of the subband samples representing a bandwidth of the subband signal, which is smaller than a bandwidth of the input signal, wherein the means is operative to provide a subband signal such that when the input signal includes a block having a predetermined number of input samples, the number of subband samples in a subband signal is smaller than the number of input samples; and means for filtering each subband signal using a reverberation filter to obtain a plurality of reverberated subband signals, wherein a plurality of reverberated subband signals together represent the decorrelation signal.

In accordance with a second aspect, the present invention provides a multi-channel decoder for decoding a mono signal and an associated inter-channel coherence measure, the inter-channel coherence measure representing a coherence between a plurality of original channels, the mono signal being derived from the plurality of original channels, having: a generator for generating a decorrelation signal from the mono signal as mentioned above; a mixer for mixing the mono signal and the decorrelation signal in accordance with a first mixing mode to obtain a first decoded output signal and in accordance with a second mixing mode to obtain a second decoded output signal, wherein the mixer is operative to determine the first mixing mode and the second mixing mode based on the inter-channel coherence measure.

In accordance with a third aspect, the present invention provides a method of generating a decorrelation signal using an input signal, having: providing a plurality of subband signals, wherein a subband signal includes a sequence of at least two subband samples, the sequence of the subband samples representing a bandwidth of the subband signal, which is smaller than a bandwidth of the input signal, wherein the step of providing is performed such that when the input signal includes a block having a predetermined number of input samples, the number of subband samples in a subband signal is smaller than the number of input samples; and filtering each subband signal using a reverberation filter to obtain a plurality of reverberated subband signals, wherein a plurality of reverberated subband signals together represent the decorrelation signal.

In accordance with a fourth aspect, the present invention provides a method of multi-channel decoding for decoding a mono signal and an associated inter-channel coherence measure, the inter-channel coherence measure representing a coherence between a plurality of original channels, the mono signal being derived from the plurality of original channels, having: generating a decorrelation signal from the mono signal in accordance with the above-mentioned method; mixing the mono signal and the decorrelation signal in accordance with a first mixing mode to obtain a first decoded output signal and in accordance with a second mixing mode to obtain a second decoded output signal, wherein the mixer is operative to determine the first mixing mode and the second mixing mode based on the inter-channel coherence measure.

In accordance with a fifth aspect, the present invention provides an apparatus for encoding a stereo signal to obtain a mono output signal and a stereo parameter set, having: means for calculating the mono signal by combining a left and a right channel of the stereo signals; means for generating a first stereo parameter set using a portion of the left channel and a portion of the right channel, the portion starting at a first time border; means for determining a validity of the first stereo parameter set for subsequent portions of the left channel and the right channel, wherein the means for determining is operative to: generate second time border, and activate the means for generating, when it is determined that the stereo parameter set is not valid anymore so that a second stereo parameter set for portions of the left and right signals starting at the second time border is generated; and means for outputting the mono signal and the first stereo parameter set and the first time border associated with the first parameter set, and the second stereo parameter set and the second time border associated with the second stereo parameter set.

In accordance with a sixth aspect, the present invention provides a method of encoding a stereo signal to obtain a mono output signal and a stereo parameter set, having: calculating the mono signal by combining a left and a right channel of the stereo signals; generating a first stereo parameter set using a portion of the left channel and a portion of the right channel, the portion starting at a first time border; determining a validity of the first stereo parameter set for subsequent portions of the left channel and the right channel, by generating a second time border, and conducting the step of generating, when it is determined that the stereo parameter set is not valid anymore so that a second stereo parameter set for portions of the left and right signals starting at the second time border is generated; and outputting the mono signal and the first stereo parameter set and the first time border associated with the first parameter set, and the second stereo parameter set and the second time border associated with the second stereo parameter set.

In accordance with a seventh aspect, the present invention provides a computer program having a computer-readable code for carrying out one of the above-mentioned methods, when running on a computer.

The present invention is based on the finding that, on the decoding side, a good decorrelation signal for generating a first and a second channel of a multi-channel signal based on the input mono signal is obtained, when a reverberation filter is used, which introduces an integer or preferably a fractional delay into the input signal. Importantly, this reverberation filter is not applied to the whole input signal. Instead, several reverberation filters are applied to several subbands of the original input signal, i.e., the mono signal so that the reverberation filtering using the reverberation filters is not applied in a time domain or in the frequency domain, i.e., in the domain which is reached, when a Fourier transform is applied. Inventively, the reverberation filtering using reverberation filters for the subbands is individually performed in the subband domain.

A subband signal includes a sequence of at least two subband samples, the sequence of the subband samples representing a bandwidth of the subband signal, which is smaller than the bandwidth of the input signal. Naturally, the frequency bandwidth of a subband signal is higher than a frequency bandwidth attributed to a frequency coefficient obtained by Fourier transform. The subband signals are preferably generated by means of a filterbank having for example 32 or 64 filterbank channels, while an FFT would have, for the same example, 1.024 or 2.048 frequency coefficients, i.e., frequency channels.

The subband signals can be subband signals obtained by subband-filtering a block of samples of the input signal. Alternatively, the subband filterbank can also be applied continuously without a block wise processing. For the present invention, however, block wise processing is preferred.

Since the reverberation filtering is not applied to the whole signal, but is applied subband-wise, a "metallic" sound caused by comb-filtering is avoided.

In cases, in which a sample period between two subsequent subband samples of the subband is too large for a good sound impression at the decoder end, it is preferred to use fractional delays in a reverberation filter such as a delay between 0.1 and 0.9 and preferably 0.2 to 0.8 of the sampling period of the subband signal. It is noted that in case of critical sampling, and when 64 subband signals are generated using a filterbank having 64 filterbank channels, the sampling period in a subband signal is 64 times larger than the sampling period of the original input signal.

It is to be noted here that the delays are an integral part of the filtering process used in the reverberation device. The output signal constitutes of a multitude of delayed versions of the input signal. It is preferred to delay signals by fractions of the subband sampling period, in order to achieve a good reverberation device in the subband domain.

In preferred embodiments of the present invention, the delay, and preferably the fractional delay introduced by each reverberation filter in each subband is equal for all subbands. Nevertheless, the filter coefficients are different for each subbands. It is preferred to use IIR filters. Depending on the actual situation, fractional delay and the filter coefficients for the different filters can be determined empirically using listening tests.

The subbands filtered by the set of reverberation filters constitute a decorrelation signal which is to be mixed with the original input signal, i.e., the mono signal to obtain a decoded left channel and decoded right channel. This mixing of a decorrelation signal with the original signal is performed based on an inter-channel coherence parameter transmitted together with the parametrically encoded signal. To obtain different left and right channels, i.e., different first and second channels, mixing of the decorrelation signal with a mono signal to obtain the first output channel is different from mixing the decorrelation signal with the mono signal to obtain the second output channel.

To obtain higher efficiency on the encoding side, multi-channel encoding is performed using an adaptive determination of the stereo parameter set. To this end, an encoder includes, in addition to a means for calculating the mono signal and in addition to a means for generating a stereo parameter set, a means for determining a validity of stereo parameter sets for subsequent portions of the left an right channels. Preferably, the means for determining is operative to activate the means for generating, when it is determined that the stereo parameter set is not valid anymore so that a second stereo parameter set is calculated for portions of the left and right channels starting at a second time border. This second time border is also determined by the means for determining a validity.

The encoded output signal then includes the mono signal, a first stereo parameter set and a first time border associated with the first parameter set and the second stereo parameter set and the second time border associated with the second stereo parameter set. On the decoding side, the decoder will use a valid stereo parameter set until a new time border is reached. When this new time border is reached, the decoding operations are performed using the new stereo parameter set.

Compared to prior art methods, which did a block wise processing and, therefore, a block wise determination of stereo parameter sets, the inventive adaptive determination of stereo parameter sets for different encoder-side determined time borders provides a high coding efficiency on the one hand end and a high coding quality on the other hand. This is due to the fact that for relatively stationary signals, the same stereo parameter set can be used for many blocks of the samples of the mono signal without introducing audible errors. On the other hand, when non-stationary signals are concerned, the inventive adaptive stereo parameter determination provides an improved time resolution so that each signal portion has its optimum stereo parameter set.

The present invention provides a solution to the prior art problems by using a reverberation unit as a de-correlator implemented with fractional delay lines in a filterbank, and using adaptive level adjustment of the de-correlated reverberated signal.

Subsequently, several aspects of the present invention are outlined.

One aspect of the invention is a method for delaying a signal by: filtering a real-valued time domain signal through the analysis part of complex filterbank; modifying the complex-valued subband signals obtained from the filtering; and filtering the modified complex-valued subband signals through the synthesis part of the filterbank; and taking the real part of the complex-valued time domain output signal, where the output signal is the sum of the signals obtained from the synthesis filtering.

Another aspect of the invention is a method for modifying the complex valued subband signals by filtering each complex-valued subband signal with a complex valued finite impulse response filter where the finite impulse response filter for subband number n is given by a discrete time Fourier transform of the form $$H_n(\omega) = \begin{cases} \exp(-i\pi(n+1/2)\tau)G_\tau(\omega), & \text{for } n \text{ even;} \\ \exp(-i\pi(n+1/2)\tau)G_\tau(\omega+\pi), & \text{for } n \text{ odd.} \end{cases}$$

where the parameter $\tau=T/L$, and where the synthesis filter bank has L subbands and the desired delay is T measured in output signal sample units.

Another aspect of the invention is a method for modifying the complex valued subband signals by filtering where the filter $G_\tau(\omega)$ approximately satisfies $V_\tau(\omega)G_\tau(\omega)+V_\tau(\omega+\pi)G_\tau(\omega+\pi)=1$, where $V_\tau(\omega)$ is the discrete time Fourier transform of the sequence $$v_\tau(k) = Ai^k \sum_l p(l)p(l-T-Lk),$$

and p(l) is the prototype filter of said complex filterbank and A is an appropriate real normalization factor.

Another aspect of the invention is a method for modifying the complex valued subband signals by filtering where the filter $G_\tau(\omega)$ satisfies $G_\tau(-\omega)=G_\tau(\omega+\pi)^*$ such that even indexed impulse response samples are real valued and odd indexed impulse response samples are purely imaginary valued.

Another aspect of the invention is a method for coding of stereo properties of an input signal, by at an encoder, calculate time grid parameters describing the location in time for each stereo parameter set, where the number of stereo parameter sets are arbitrary, and at a decoder, applying parametric stereo synthesis according to that time grid.

Another aspect of the invention is a method for coding of stereo properties of an input signal, where the time localisation for the first stereo parameter set is, in the case of where a time cue for the stereo parameter set coincides with the beginning of a frame, signalled explicitly instead of signalling the time pointer.

Another aspect of the invention is a method for generation of stereo decorrelation for parametric stereo reconstruction, by at a decoder, applying an artificial reverberation process to synthesise the side signal.

Another aspect of the invention is a method for generation of stereo decorrelation for parametric stereo reconstruction by, at the decoder, the reverberation process is made within a complex modulated filterbank using phase delay adjustment in each filter bank channel.

Another aspect of the invention is a method for generation of stereo decorrelation for parametric stereo reconstruction by, at the decoder, the reverberation process utilises a detector designed for finding signals where the reverberation tail could be unwanted and let the reverberation tail be attenuated or removed.

BRIEF DESCRIPTION OF THE DRAWINGS

The present invention will now be described by way of illustrative examples, not limiting the scope or spirit of the invention, with reference to the accompanying drawings, in which.

DESCRIPTION OF PREFERRED EMBODIMENTS

Figure 1:
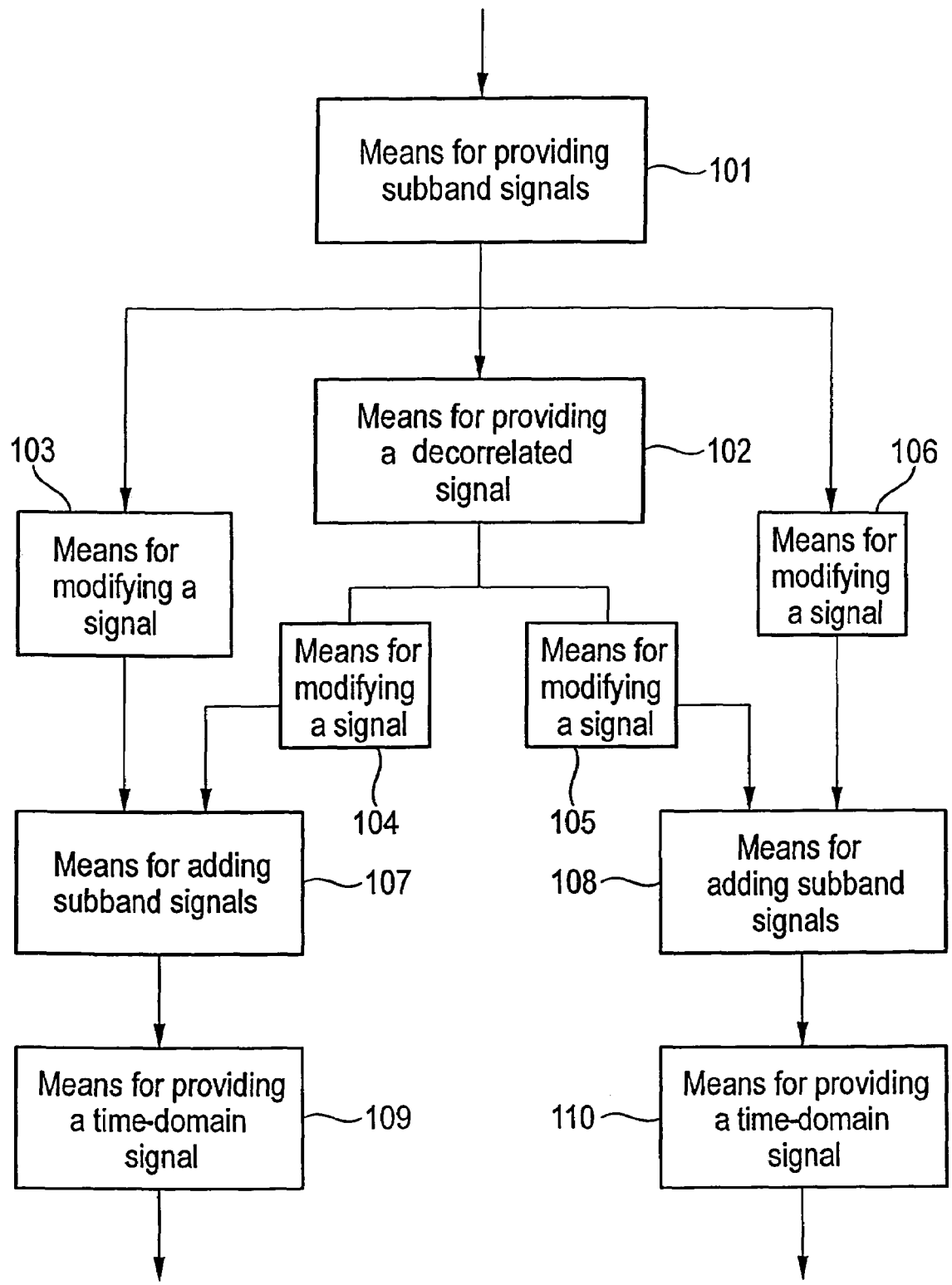
FIG. 1 illustrates a block diagram of the inventive apparatus.

The below-described embodiments are merely illustrative for the principles of the present invention for parametric stereo coding. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Delaying a signal by a fraction of a sample can be achieved by several prior art interpolation methods. However, special cases arises when the original signal is available as oversampled complex valued samples. Performing fractional delay in the qmf bank by only applying phase delay by a factor for, each qmf channel corresponding to a constant time delay, results in severe artefacts.

This can efficiently be avoided by using a compensation filter according to a novel approach allowing high quality approximations to arbitrary delays in any complex-exponential-modulated filterbank. A detailed description follows below.

A Continuous Time Model

For ease of computations a complex exponential modulated L-band filterbank will be modelled here by a continuous time windowed transform using the synthesis waveforms $$u_{n,k}(t)=v(t-k)\exp[i\pi(n+\tfrac{1}{2})(t-k+\theta)], \quad (1)$$

where n,k are integers with n≧0 and θ is a fixed phase term. Results for discrete-time signals are obtain by suitable sampling of the t-variable with spacing 1/L. It is assumed that the real valued window v(t) is chosen such that for real valued signals x(t) it holds to very high precision that $$x(t) = 2\operatorname{Re}\left\{\sum_{n=0}^{\infty}\sum_{k=-\infty}^{\infty} c_n(k)u_{n,k}(t)\right\} \quad (2)$$

$$\text{if } c_n(k) = \int_{-\infty}^{\infty} x(t)u_{n,k}^*(t)dt, \quad (3)$$

where * denotes complex conjugation. It is also assumed that v(t) is essentially band limited to the frequency interval [−π, π]. Consider the modification of each frequency band n by filtering the discrete time analysis samples $c_n(k)$ with a filter with impulse response $h_n(k)$, $$d_n(k) = \sum_{l} h_n(l)c_n(k-l). \quad (4)$$

Then the modified synthesis $$y(t) = 2\operatorname{Re}\left\{\sum_{n=0}^{\infty}\sum_{k=-\infty}^{\infty} d_n(k)u_{n,k}(t)\right\} \quad (5)$$

can be computed in the frequency domain to be $$\hat{y}(\omega)=H(\omega)\hat{x}(\omega), \quad (6)$$

where $\hat{f}(\omega)$ denotes Fourier transforms of $f(t)$ and $$H(\omega) = \sum_{n=-\infty}^{\infty} H_n(\omega)|\hat{v}(\omega - \pi(n+1/2))|^2. \quad (7)$$

Here, $$H_n(\omega) = \sum_{k} h_n(k)\exp(-ik\omega)$$

is the discrete time Fourier transform of the filter applied in frequency band n for n≧0 and $$H_n(\omega)=H_{-1-n}(-\omega)^* \text{ for } n<0 \quad (8)$$

Observe here that the special case $H_n(\omega)=1$ leads to $H(\omega)=1$ in (7) due to the special design of the window v(t). Another case of interest is $H_n(\omega)=\exp(-i\omega)$ which gives $H(\omega)=\exp(-i\omega)$, so that y(t)=x(t−1).

The Proposed Solution

In order to achieve a delay of size τ, such that y(t)=x(t−τ), the problem is to design filters $H_n(\omega)$ for n≧0 such that $$H(\omega)=\exp(-i\tau\omega), \quad (9)$$

where H(ω) is given by (7) and (8). The particular solution proposed here is to apply the filters $$H_n(\omega) = \begin{cases} \exp(-i\pi(n+1/2)\tau)G_\tau(\omega), & \text{for } n \text{ even;} \\ \exp(-i\pi(n+1/2)\tau)G_\tau(\omega+\pi), & \text{for } n \text{ odd.} \end{cases} \quad (10)$$

Here $G_\tau(-\omega)=G_\tau(\omega+\pi)^*$ implies consistency with (8) for all n. Insertion of (10) into the right hand side of (7) yields $$H(\omega)=\exp(-i\omega\tau)[V_\tau(\omega)G_\tau(\omega)+V_\tau(\omega+\pi)G_\tau(\omega+\pi)] \quad (11)$$

where $$V_\tau(\omega) = \sum_{n} b(\omega - \pi(2n+1/2)) \text{ with } b(\omega) = \exp(i\tau\omega)|\hat{v}(\omega)|^2.$$

Elementary computations show that $V_\tau(\omega)$ is the discrete time Fourier transform of $$v_\tau(k) = i^k \int_{-\infty}^{\infty} v(t)v(t-\tau-k)dt. \quad (12)$$

Very good approximations to the perfect delay can be obtained by solving the linear system $$V_\tau(\omega)G_\tau(\omega)+V_\tau(\omega+\pi)G_\tau(\omega+\pi)=1 \quad (13)$$

in the least squares sense with a FIR filter $$G_\tau(\omega) = \sum_{k=-N}^{M} g_\tau(k)\exp(-ik\omega).$$

In terms of filter coefficients, the equation (13) can be written $$2\sum_{l} v_\tau(2k-l)g_\tau(l) = \delta[k], \quad (14)$$

where δ[k]=1 for k=0 and δ[k]=0 for k≠0.

In the case of a discrete time L-band filter bank with prototype filter p(k), the obtained delay in sample units is Lτ and the computation (12) is replaced by $$v_\tau(k) = i^k \sum_l p(l)p(l - T - Lk), \quad (15)$$

where T is the integer closest to Lτ. Here p(k) is extended by zeros outside its support. For a finite length prototype filter, only finitely many $v_\tau(k)$ are different from zero, and (14) is system of linear equations. The number of unknowns $g_\tau(k)$ is typically chosen to be a small number. For good QMF filter bank designs, 3-4 taps already give very good delay performance. Moreover, the dependence of the filter taps $g_\tau(k)$ on the delay parameter τ can often be modelled successfully by low order polynomials.

Signalling Adaptive Time Grid for Stereo Parameters

Parametric stereo systems always leads to compromises in terms of limited time or frequency resolution in order to minimise conveyed data. It is however well known from psycho-acoustics that some spatial cues can be more important than others, which leads to the possibility to discard the less important cues. Hence, the time resolution does not have to be constant. Great gain in bitrate could be achieved by letting the time grid synchronise with the spatial cues. It can easily be done by sending a variable number of parameter sets for each data frame that corresponds to a time segment of fixed size. In order to synchronise the parameter sets with corresponding spatial cues, additional time grid data describing the location in time for each parameter set has to be sent. The resolution of those time pointers could be chosen to be quite low to keep the total amount of data minimised. A special case where a time cue for a parameter set coincides with the beginning of a frame could be signalled explicitly to avoid sending that time pointer.

Figure 4:
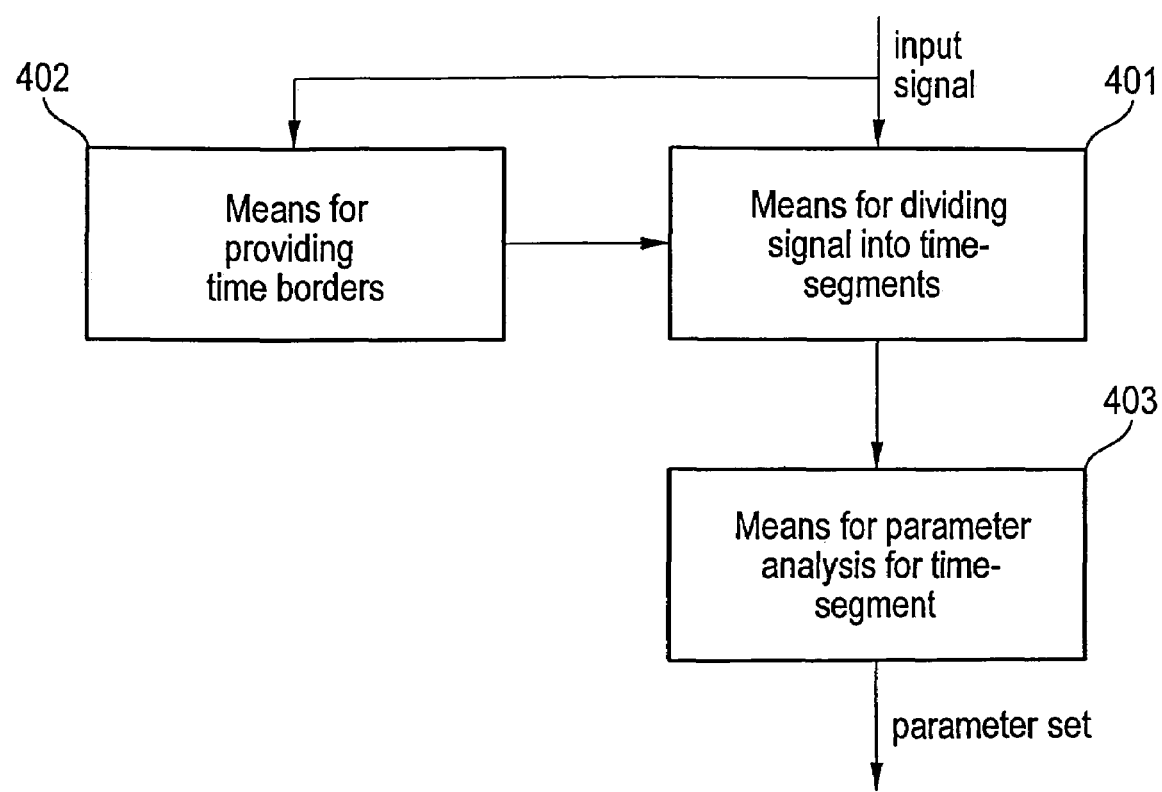
FIG. 4 illustrates a block diagram of the division of the parametric stereo parameters sets into time segments, based on the signal characteristic.

FIG. 4 illustrates an inventive apparatus for performing parameter analysis for time segments having variable and signal dependant time borders. The inventive apparatus includes means 401 for dividing the input signal into one or several time segments. The time borders that separate the time segments are provided by means 402. Means 402 uses a detector specially designed for extracting spatial cues that is relevant for deciding where to set the time borders. Means 401 outputs all the input signal divided into one or several time segments. This output is input to means 403 for separate parameter analysis for each time segment. Means 403 outputs one parameter set per time segment being analysed.

Figure 5:
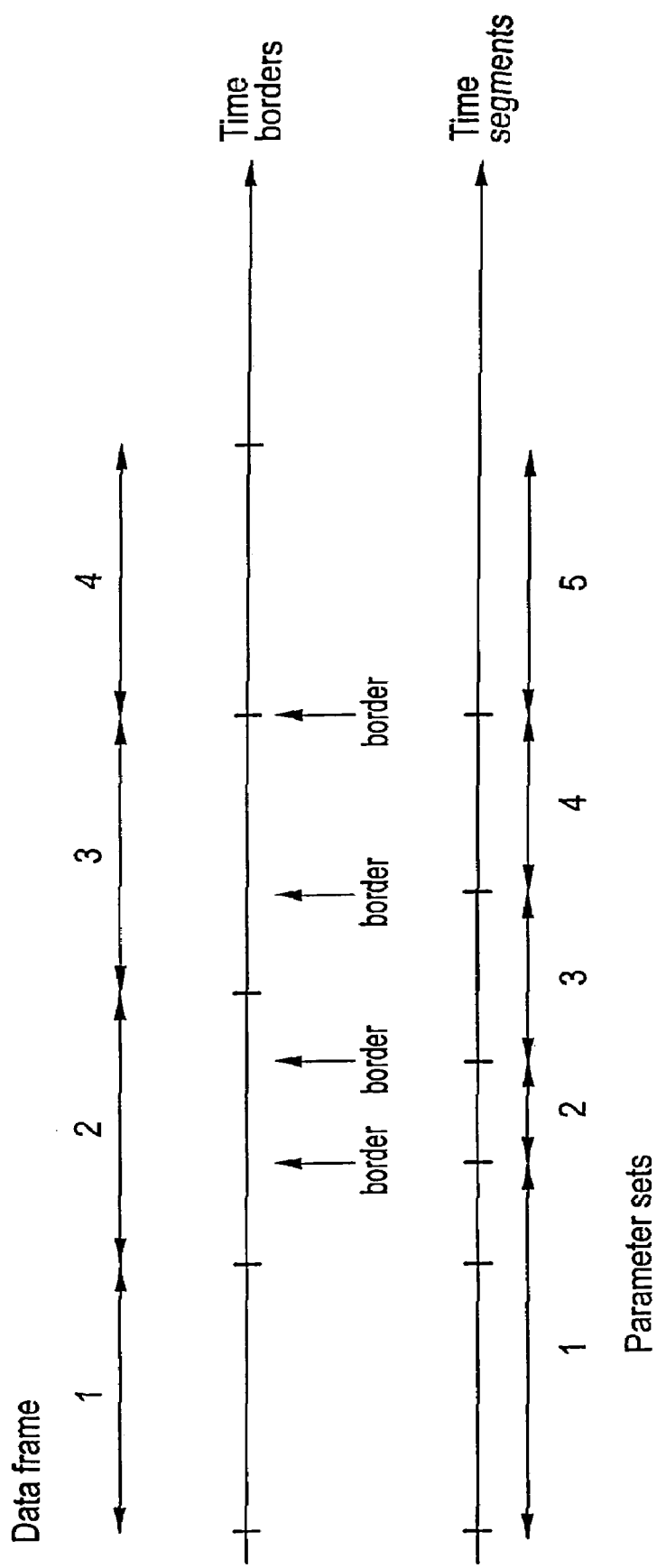
FIG. 5 illustrates an example of the division of the parametric stereo parameters sets into time segments, based on the signal characteristic.

FIG. 5 illustrates an example of how the time grid generator can perform for a hypothetical input signal. In this example one parameter set per data frame is used if no other time border information is present. Hence, when no other time border information is present, the inherent time borders of the data frame is used. The in FIG. 5 depicted time borders are the output from means 402 in FIG. 4. The in FIG. 5 depicted time segments are provided by means 401 in FIG. 4.

The apparatus for encoding a stereo signal to obtain a mono output signal and the stereo parameter set includes the means for calculating the mono signal by combining a left and a right channel of the stereo signals by weighted addition. Additionally, a means 403 are generating a first stereo parameter set using a portion of the left channel and a portion of the right channel, the portions starting at a first time border is connected to the means for determining the validity of the first stereo parameter set for subsequent portions of the left channel and the right channel.

The means for determining is collectively formed by the means 402 and 401 in FIG. 1.

Particularly, the means for determining is operative to generate a second time border and to activate the means for generating, when it is determined that this first stereo parameter set is not valid anymore so that a second stereo parameter set for portions of the left and right channels starting at the second time border is generated.

Not shown in FIG. 4 are means for outputting the mono signal, the first stereo parameter set and the first time border associated with the first stereo parameter set and the second stereo parameter set and the second time border associated with the second stereo parameter set as the parametrically encoded stereo signal. The means for determining a validity of a stereo parameter set can include a transient detector, since the probability is high that, after a transient, a new stereo parameter has to be generated, since a signal has changed its shape significantly. Alternatively, the means for determining a validity can include an analysis-by-synthesis device, which is adapted for decoding the mono signal and the stereo parameter set to obtain a decoded left and a decoded right channel, to compare the decoded left channel and the decoded right channel to the left channel and to the right channel, and to activate the means for generating, when the decoded left channel and the decoded right channel are different from the left channel and the right channel by more than the predetermined threshold.

Data frame 1: The time segment corresponding to parameter set 1 starts at the beginning of data frame 1 since no other time border information is present in this data frame.

Data frame 2: Two time borders are present in this data frame. The time segment corresponding to parameter set 2 starts at the first time border in this data frame. The time segment corresponding to parameter set 3 starts at the second time border in this data frame.

Data frame 3: One time border is present in this data frame. The time segment corresponding to parameter set 4 starts at the time border in this data frame.

Data frame 4: One time border is present in this data frame. This time border coincides with the start border of the data frame 4 and does not have to be signalled since this is handled by the default case. Hence, this time border signal can be removed. The time segment corresponding to parameter set 5 starts at the beginning of data frame 4, even without signalling this time border.

Using Artificial Reverberation as Decorrelation Method for Parametric Stereo Reconstruction One vital part of making the stereo synthesis in a parametric stereo system is to decrease the coherence between the left and right channel in order to create wideness of the stereo image. It can be done by adding a filtered version of the original mono signal to the side signal, where the side and mono signal is defined by:

mono=(left+right)/2, and side=(left−right)/2, respectively.

In order to not change the timbre too much, the filter in question should preferably be of all-pass character. One successful approach is to use similar all-pass filters used for artificial reverberation processes. Artificial reverberation algorithms usually requires high time resolution to give an impulse response that is satisfactory diffuse in time. There are great advantages in basing an artificial reverberation algorithm on a complex filter bank such as the complex qmf bank. The filterbank provides excellent possibilities to let the reverberation properties be frequency selective in terms of for example reverberation equalisation, decay time, density and timbre. However, the filter bank implementations usually exchanges time resolution for higher frequency resolution which normally makes it hard to implement a reverberation process that is smooth enough in time. To deal with this problem a novel method would be to use a fractional delay approximation by only applying phase delay by a factor for, each qmf channel corresponding to a constant time delay. This primitive fractional delay method introduces severe time smearing that fortunately is very much desired in this case. The time smearing contributes to the time diffusion which is highly desirable for reverberation algorithms and gets bigger as the phase delay approaches pi/2 or −pi/2.

Artificial reverberation processes are for natural reasons processes with an infinite impulse response, and offers natural exponential decays. In [PCT/SE02/01372] it is pointed out that if a reverberation unit is used for generating a stereo signal, the reverberation decay might sometimes be unwanted after the very end of a sound. These unwanted reverb-tails can however easily be attenuated or completely removed by just altering the gain of the reverb signal. A detector designed for finding sound endings can be used for that purpose. If the reverberation unit generates artefacts at some specific signals e.g., transients, a detector for those signals can also be used for attenuating the same.

FIG. 1 illustrates an inventive apparatus for the decorrelation method of signals as used in a parametric stereo system. The inventive apparatus includes means 101 for providing a plurality of subband signals. The providing means can be a complex QMF filterbank, where every signal is associated with a subband index.

The subband signals output by the means 101 from FIG. 1. are input into a means 102 for providing a de-correlated signal 102, and into a means 103 and 106 for modifying the subband signal. The output from 102 is input into a means 104 and 105 for modifying the of the signal, and the output of 103, 104, 105 and 106 are input into a means for adding, 107 and 108, the subband signals.

In the presently described embodiment of the invention, the means for modifying 103,104, 105 and 106, the subband signals, adjusts the level of the de-correlated signal and the unprocessed signal being the output of 101, by multiplying the subband signal with a gain factor, so that every sum of every pair results in a signal with the amount of de-correlated signal given by the control parameters. It should be noted that the gain factors used in the means for modifying, 103-106, are not limited to a positive value. It can also be a negative value.

The output from the means for adding subband signals 107 and 108, is input to the means for providing a time-domain signal 109 and 110. The output from 109 corresponds to the left channel of the re-constructed stereo signal, and the output from 110 corresponds to the right channel of the re-constructed stereo signal. In the here described embodiment the same decorrelator is used for both output channels, while the means for adding the de-correlated signal with the un-processed signal are separate for the two output channels. The presently described embodiment thereby ensures that the two output signals can be identical as well as completely de-correlated, dependent on the control data provided to the means for adjusting the levels of the signals, and the control data provided to the means for adding the signals.

Figure 2:
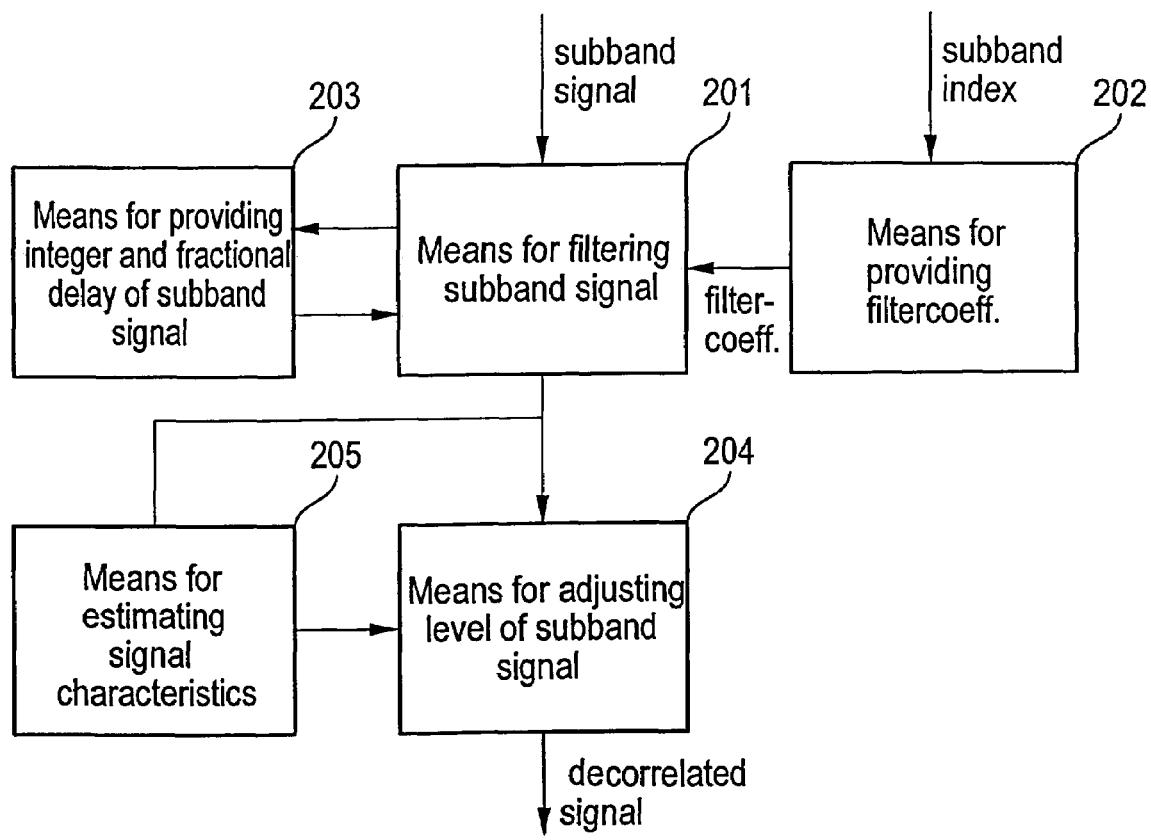
FIG. 2 illustrates a block diagram of the means for generating a de-correlated signal.

In FIG. 2 a block diagram of the means for providing a decorrelated signal is displayed. The input subband signal is input to the means for filtering a subband signal 201. In the presently described embodiment of the present invention the filtering step is a reverberation unit incorporating all-pass filtering. The filter coefficients used are given by the means for providing filter coefficients 202. The subband index of the currently processed subband signal is input to 202. In one embodiment of the present invention different filter coefficients are calculated based on the subband index provided to 202. The filtering step in 201, relies on delayed samples of the input subband signal as well as delayed samples of intermediate signals in the filtering procedure.

It is an essential feature of the present invention that means for providing integer subband sample delay and fractional subband sample delay are provided by 203. The output of 201 is input to a means for adjusting the level of the subband signal 204, and also to a means for estimating signal characteristics of the subband signal 205. In a preferred embodiment of the present invention the characteristics estimated is the transient behaviour of the subband signal. In this embodiment a detected transient is signalled to the means for adjusting the level of a subband signal 204, so that the level of the signal is reduced during transient passages. The output from 204 is the de-correlated signal input to 104 and 105 of FIG. 1.

Figure 3:
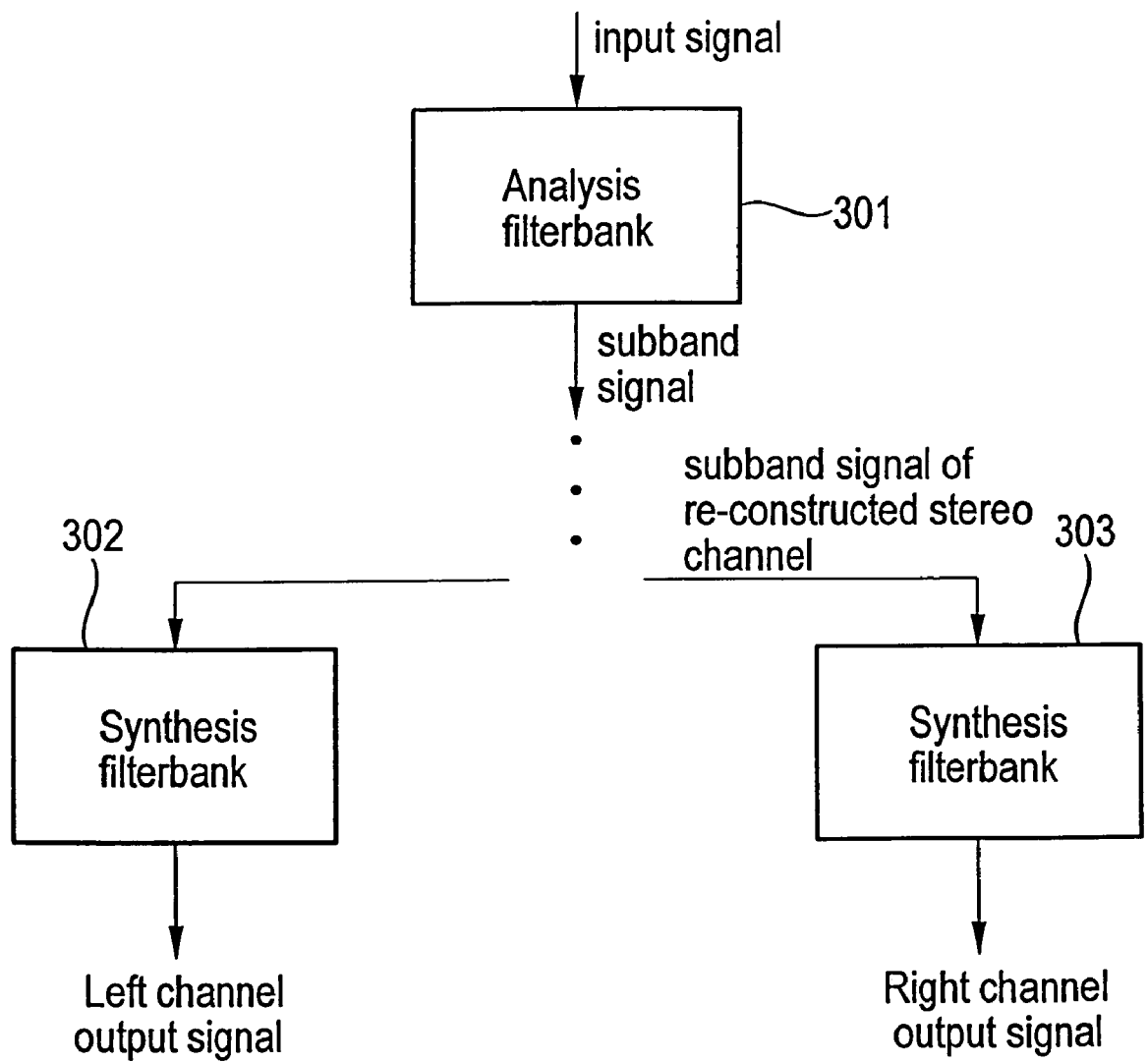
FIG. 3 illustrates the analysis of a single channel and the synthesis of the stereo channel pair based on the re-constructed stereo subband-signals according to the present invention.

In FIG. 3 the single analysis filterbank and the two synthesis filterbanks are shown. The analysis filterbank 301, operates on the mono input signal, while the synthesis filterbanks 302 and 303 operate on the re-constructed stereo signals.

FIG. 1, therefore, shows the inventive apparatus for generating a decorrelation signal which is indicated by reference 102. As it is shown in FIG. 1 or 3, this apparatus includes means for providing a plurality of subband signals, wherein a subband signal includes the sequence of at least two subband samples, the sequence of the subband samples representing a bandwidth of the subband signal which is smaller than a bandwidth of the input signal. Each subband signal is input into the means 201 for filtering. Each means 201 for filtering includes a reverberation filter so that a plurality of reverberated subband signals are obtained, wherein the plurality of reverberated subband signals together represent the decorrelation signal. Preferably, as it is shown in FIG. 2, there can be a subband-wise postprocessing of reverberated subband signals which is performed by block 204, which is controlled by block 205.

Each reverberation filter is set to a certain delay, and preferably a fractional delay, and each reverberation filter has several filter coefficients, which, as it is shown in FIG. 2, depend on the subband index. This means that it is preferred to use the same delay for each subband but to use different sets of filter coefficients for the different subbands. This is symbolized by means 203 and 202 in FIG. 2, although it is to be mentioned here that delays and filter coefficients are preferably fixedly determined when shipping a decorrelation device, wherein the delays and filter coefficients may be determined empirically using listening tests etc.

A multi-channel decoder is shown by FIG. 1 and includes the inventive apparatus for generating the correlation signal, which is termed 102 in FIG. 1. The multi-channel decoder shown in FIG. 1 is for decoding a mono signal and an associated inter-channel coherence measure, the inter-channel coherence measure representing a coherence between a plurality of original channels, wherein the mono signal is derived from the plurality of original channels. Block 102 in FIG. 1 constitutes a generator for generating a decorrelation signal for the mono signal. Blocks 103, 104, 105, 106 and 107 and 108 constitute a mixer for mixing the mono signal and the decorrelation signal in accordance with the first mixing mode to obtain a first decoded output signal and in accordance with the second mixing mode to obtain a second decoded output signal, wherein the mixer is operative to determine the first mixing mode and the second mixing mode based on the inter-channel coherence measure transmitted as a side information to the mono signal.

The mixer is preferably operative to mix in a subband domain based on separate inter-channel coherence measures for different subbands. In this case, the multi-channel decoder further comprises means 109 and 110 for converting the first and second decoded output signals from the subband domain in a time domain to obtain a first decoded output signal and a second decoded output signal in the time domain. Therefore, the inventive means 102 for generating a decorrelation signal and the inventive multi-channel decoder as shown in FIG. 1 operate in the subband domain and perform, as the very last step, a subband domain to time domain conversion.

Depending on the actual situation, the inventive device can be implemented in hardware or in software or in a firmware including hardware constituents and software constituents. When implemented in software partially or fully, the invention also is a computer program having a computer-readable code for carrying out the inventive methods when running on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for generating a decorrelation signal using an input signal, comprising:
   an input signal including a block having a predetermined number of input samples, wherein the input signal is sampled before being filtered;
   a provider for providing a plurality of subband signals, wherein a subband signal includes a sequence of at least two subband samples, the sequence of the subband samples representing a bandwidth of the subband signal, which is smaller than a bandwidth of the input signal, wherein the provider is configured to provide a decimated subband signal such that the number of subband samples in a subband signal is smaller than the number of input samples; and
   a filter for filtering each subband signal using a reverberation filter to obtain a plurality of reverberated subband signals, wherein the step of decimating the subband signal occurs before a step of filtering, and wherein a plurality of reverberated subband signals together represent the decorrelation signal.

2. The apparatus in accordance with claim 1, wherein the filter for filtering is configured to apply a delay to the subband signal.

3. The apparatus in accordance with claim 2, wherein the filter for filtering is configured to apply a fractional delay to a subband signal, the fractional delay being greater than "0" and smaller than a sampling period of the subband signal.

4. The apparatus in accordance with claim 3, wherein the fractional delay is smaller than 0.9 of the sampling period of the subband signal and greater than 0.1 of the sampling period of the subband signal.

5. The apparatus in accordance with claim 1, wherein the filter for filtering is configured to have an all-pass characteristic.

6. The apparatus in accordance with claim 1, wherein the reverberation filter is configured to apply the same delay to each subband signal.

7. The apparatus in accordance with claim 1, wherein the reverberation filter is configured to have different sets or filter coefficients for each subband signal.

8. The apparatus in accordance with claim 1, wherein the reverberation filter is configured to introduce predetermined phase delays into the subband signals.

9. The apparatus in accordance with claim 1, wherein the number of subbands is smaller than or equal to 128 and larger than 1.

10. The apparatus in accordance with claim 1, wherein the number of subband samples multiplied by the number of subbands results in the predetermined number of input samples.

11. The apparatus in accordance with claim 1, wherein the provider for providing is a complex quadrature-mirror-filter-bank.

12. A multi-channel decoder for decoding a mono signal and an associated inter-channel coherence measure, the inter-channel coherence measure representing a coherence between a plurality of original channels, the mono signal being derived from the plurality of original channels, comprising:
    a generator for generating a decorrelation signal from the mono signal comprising an input signal including a block having a predetermined number of input samples, wherein the input signal is sampled before being filtered, a provider for providing a plurality of subband signals, wherein a subband signal includes a sequence of at least two subband samples, the sequence of the subband samples representing a bandwidth of the subband signal, which is smaller than a bandwidth of the input signal, wherein the provider is configured to provide a decimated subband signal such that the number of subband samples in a subband signal is smaller than the number of input samples; and a filter for filtering each subband signal using a reverberation filter to obtain a plurality of reverberated subband signals, wherein a step of decimating the subband signal occurs before a step of filtering, and wherein a plurality of reverberated subband signals together represent the decorrelation signal;
    a mixer for mixing the mono signal and the decorrelation signal in accordance with a first mixing mode to obtain a first decoded output signal and in accordance with a second mixing mode to obtain a second decoded output signal, wherein the mixer is configured to determine the first mixing mode and the second mixing mode based on the inter-channel coherence measure.

13. The multi-channel decoder in accordance with claim 12, wherein the mixer is configured to mix in a subband domain based on separate inter-channel coherence measures for different subbands, and
    which further comprises a converter for converting the first and the second decoded output signals from the subband domain in the time domain to obtain time domain first and second decoded output signals.

14. The multi-channel decoder in accordance with claim 12, wherein the plurality of original channels include a left stereo channel and a right stereo channel, and in which the first decoded output signal is a decoded left stereo channel, and in which the second decoded output signal is a decoded right stereo channel.

15. The multi-channel decoder in accordance with claim 12, wherein the mixer includes a first modifier for modifying a subband of the mono signal or a modifier for modifying the subband of the decorrelation signal.

16. The multi-channel decoder in accordance with claim 15, wherein the first and the second modifier for modifying are implemented as signal level modifier devices.

17. The multi-channel decoder in accordance with claim 15, wherein the mixer includes an adder for adding an unmodified subband of the mono signal and a modified subband of the decorrelation signal or for adding a modified subband of the mono signal and an unmodified subband of the decorrelation signal or for adding a modified subband of the mono signal and a modified subband of the decorrelation signal to obtain a subband of a first decoded output channel or the second decoded output channel.

18. The multi-channel decoder in accordance with claim 12, wherein the generator includes a filterbank for providing the plurality of subbands of the mono signal, the filterbank having a subband output connected to the mixer and the reverberation filter for the subband.

19. A method of generating a decorrelation signal using an input signal, comprising:
  providing an input signal including a block having a predetermined number of input samples, wherein the input signal is sampled before being filtered;
  decimating a plurality of subband signals, forming a plurality of decimated subband signals;
  providing a plurality of decimated subband signals, wherein a decimated subband signal includes a sequence of at least two subband samples, the sequence of the subband samples representing a bandwidth of the subband signal, which is smaller than a bandwidth of the input signal, wherein the step of providing is performed such that the number of subband samples in a subband signal is smaller than the number of input samples; and
  filtering each subband signal using a reverberation filter to obtain a plurality of reverberated subband signals, wherein a plurality of reverberated subband signals together represent the decorrelation signal.

20. A method of multi-channel decoding for decoding a mono signal and an associated inter-channel coherence measure, the inter-channel coherence measure representing a coherence between a plurality of original channels, the mono signal being derived from the plurality of original channels, comprising:
  generating a decorrelation signal from the mono signal comprising:
    providing an input signal including a block having a predetermined number of input samples, wherein the input signal is sampled before being filtered;
    decimating a plurality of subband signals, forming a plurality of decimated subband signals;
    providing a plurality of decimated subband signals, wherein a decimated subband signal includes a sequence of at least two subband samples, the sequence of the subband samples representing a bandwidth of the subband signal, which is smaller than a bandwidth of the input signal, wherein the step of providing is performed such that the number of subband samples in a subband signal is smaller than the number of input samples; and
    filtering each subband signal using a reverberation filter to obtain a plurality of reverberated subband signals, wherein a plurality of reverberated subband signals together represent the decorrelation signal;
  mixing the mono signal and the decorrelation signal in accordance with a first mixing mode to obtain a first decoded output signal and in accordance with a second mixing mode to obtain a second decoded output signal, wherein the mixer is configured to determine the first mixing mode and the second mixing mode based on the inter-channel coherence measure.

21. At least one computer readable medium containing a computer program product comprising program code for carrying out a method of generating a decorrelation signal using an input signal, comprising:
  providing an input signal including a block having a predetermined number of input samples, wherein the input signal is sampled before being filtered;
  decimating a plurality of subband signals, forming a plurality of decimated subband signals;
  providing a plurality of decimated subband signals, wherein a decimated subband signal includes a sequence of at least two subband samples, the sequence of the subband samples representing a bandwidth of the subband signal, which is smaller than a bandwidth of the input signal, wherein the step of providing is performed such that the number of subband samples in a subband signal is smaller than the number of input samples; and
  filtering each subband signal using a reverberation filter to obtain a plurality of reverberated subband signals, wherein a plurality of reverberated subband signals together represent the decorrelation signal, when running on a computer.

* * * * *